United States Patent [19]

Lynch et al.

[11] Patent Number: 5,294,514
[45] Date of Patent: Mar. 15, 1994

[54] VACUUM ROLL SEPARATION SYSTEM FOR PHOTOGRAPHIC PAPER

[75] Inventors: William P. Lynch, Honeoye Falls; John Texter, Rochester, both of N.Y.

[73] Assignee: Eastman Kodak Company, Rochester, N.Y.

[21] Appl. No.: 858,726

[22] Filed: Mar. 27, 1992

[51] Int. Cl.$^5$ .................... G03C 8/32; G03C 8/50
[52] U.S. Cl. .................. 430/203; 430/206; 430/256; 264/DIG. 47
[58] Field of Search ............ 430/203, 256, 206; 264/DIG. 47

[56] References Cited

U.S. PATENT DOCUMENTS

| | | | |
|---|---|---|---|
| 3,395,073 | 7/1968 | Davis | 162/369 |
| 3,544,405 | 12/1970 | Nakai et al. | 156/164 |
| 3,677,753 | 7/1972 | Francis et al. | 430/206 |
| 3,770,554 | 11/1973 | Jones et al. | 156/510 |
| 3,902,960 | 9/1975 | Zentner et al. | 162/199 |
| 4,016,032 | 4/1977 | Kankaanpaa | 162/305 |
| 4,087,182 | 5/1978 | Aiba et al. | 355/100 |
| 4,165,251 | 8/1979 | Matsumoto et al. | 156/584 |
| 4,183,751 | 1/1980 | Matsumoto et al. | 430/258 |
| 4,261,790 | 4/1981 | Brinker et al. | 156/584 |
| 4,359,518 | 11/1982 | Hanselman et al. | 430/236 |
| 4,416,718 | 11/1983 | Fair | 156/344 |
| 4,631,110 | 12/1986 | Tsumura et al. | 430/256 |
| 4,668,602 | 5/1987 | Hosaka et al. | 430/207 |
| 4,693,784 | 9/1987 | Aula et al. | 162/202 |
| 4,916,043 | 4/1990 | Nagumo et al. | 430/203 |
| 5,164,280 | 11/1992 | Texter et al. | 430/256 |

FOREIGN PATENT DOCUMENTS 2751862 6/1978 Fed. Rep. of Germany .
3526696 2/1986 Fed. Rep. of Germany .

*Primary Examiner*—Charles L. Bowers, Jr.
*Assistant Examiner*—Mark F. Huff
*Attorney, Agent, or Firm*—Paul A. Leipold

[57] ABSTRACT

The objects of the invention are generally accomplished by a method of delaminating imaging materials comprising providing an imaging material comprising donor and receiver elements, heating said imaging material, applying opposed forces to said donor and receiver elements to separate said imaging material into donor and receiver elements, and accumulating the separated donor element. In a preferred method one or both of said opposed forces is vacuum and when the vacuum is released from said donor element, accumulating takes place by spooling after separation.

The apparatus for delamination of imaging materials comprises means for applying heat and pressure to said imaging material, means to apply a separating force to at least one of said donor element and receiver element forming said imaging material and means to separate said donor element and said receiver element. In a preferred embodiment the apparatus further comprises means to spool said donor element and means to preheat said imaging material prior to applying said separating force.

21 Claims, 6 Drawing Sheets

VACUUM ROLL SEPARATION SYSTEM FOR PHOTOGRAPHIC PAPER

TECHNICAL FIELD

This invention relates to photographic imaging systems that utilize silver halide based radiation sensitive layers and associated formation of image dyes. In particular, this invention relates to such systems wherein the resulting dye images are separated from the silver images by a diffusion transfer process, whereby dye images are formed by diffusion in layers substantially free of silver and silver halide. More particularly, this invention relates to apparatus for effecting the automated separation of donor and receiver elements in such diffusion transfer systems.

BACKGROUND ART

Current photographic technology entails composite film and paper structures comprising a support and a layer containing photosensitive silver halide crystals which are exposed to actinic radiation and processed by contacting with processing solutions whereby a visible image is formed within said layer. During said processing some of the silver halide crystals are removed from these layers by dissolution (fixation) and reside in the bulk processing solutions used in the contact fixation process. Such seasoned fixation solutions constitute liquid, heavy-metal waste. Novel methods of imaging in such materials, such as the heat image separation system described in U.S. Application Ser. No. 07/804,868 of Willis and Texter filed Dec. 6, 1991, eliminate such fixation and other heavy metal waste (such as that from bleaching of silver images) by separating the dye images from the silver images, using diffusion transfer processes and special dye receiving layers. The essential morphology of such an imaging system essentially consists of a conventional multilayer photographic element coated on a polymeric receiver element. Images are created by conventional radiation sensitivities in the silver halide emulsion containing layers, and these images are amplified using conventional aqueous color development processes. After a given development time, the development is stopped with an appropriate stop bath, and thereafter the element is dried. No fixing or bleaching chemistry is invoked in this process. After the elements have been dried, they are subjected to heating, in order to drive the image dyes to the receiver layer. After such image transfer, the donor layers are removed and recycled, to recover silver and valuable fine organic compounds, and the receiver/base combination is retained as the final print material.

RELATED ART

Brinker and Hamilton, in U.S. Pat. No. 4,261,790, disclose an apparatus for stripping filter paper from filter rod. Finite lengths of paper encased cellulose acetate filter material are propelled past rotary cutters on either side of the direction of travel which slit the paper. The pair of rollers above and below the slit paper/cellulose acetate length first separate the paper from the filter material by means of suction and then eject the vacuum adhered paper from the roller by means of a pressurized air stream which emanates from the roller(s). See columns 3, line 4 through column 5, line 16, and their FIG. 3.

Zentner et al., in U.S. Pat. No. 3,902,960, disclose a suction roll comprising multiple internal zones which facilitate the collection, temporary storage, and final release of water within the roller which is used to remove water from a moving web in papermaking processes (see column 4, lines 55-63 and column 5, lines 21-35 in their published specification). The zoned vacuum roller allows for control over the degree of vacuum applied and variation in release of collected water (column 11, line 10 through column 12, line 10).

A vacuum or suction roller for use in web dewatering processes in papermaking, wherein the roller structure has variable zones within for optimizing collection, storage, and transfer of water removed by suction from webs was disclosed by Zentner et al. in U.S. Pat. No. 3,902,960. A vacuum roller capable of both vacuum and a jet of air pressure was disclosed by Brinker and Hamilton in U.S. Pat. No. 4,261,790. Their vacuum roller is employed in pairs to remove paper casings from filter material. Sawyer and Sawyer, in U.S. Pat. No. 4,714,523, disclose suction roll seal strips with teflon insert, for use in papermaking machines.

Aula and Kerttula, in U.S. Pat. No. 4,693,784 and in U.K. Pat. Application No. 2,173,832 A, disclose a suction roll and method for applying a negative pressure over a sector of a roll. Fair, in U.S. Pat. No. 4,416,718, discloses a process and apparatus for making a thermoplastic polymer sheet, and further a process and apparatus for splitting said sheet so as to divide the sheet at the center thereof into two thin sheets. Fair's invention utilizes a plurality of heated rollers.

Matsumoto et al., in U.S. Pat. No. 4,183,751, disclose a process and apparatus for stripping and developing photosensitive material. Their apparatus uses a plurality of rollers.

Aiba et al., in U.S. Pat. No. 4,087,182, disclose a process and apparatus for producing a photopolymer plate having relief images thereon. They disclose means for coating a liquid photosensitive material onto a web of protective film material. A length of backing material is then laminated onto the upper surface of the coated layer to form an assembly. The assembly is moved to a relief exposure station and exposed to actinic radiation. After exposure, the protective film material is peeled off from the lower surface of the exposed layer and delivered to a washing section wherein unhardened portions of the layer are washed away to produce a relief image on the backing material. A plurality of drive and guide rollers are used in the apparatus.

Kankaanpaa, in U.S. Pat. No. 4,016,032, discloses a suction roll for transferring a web away from a press section in paper manufacturing.

Jones et al., in U.S. Pat. No. 3,770,554, disclose an apparatus comprising bite rollers for splitting a softenable film. This apparatus firstly laminates donor and receiver webs to both sides of a softenable film, and subsequently separates the film into two layers. One of these layers contains a positive image of marker particles, and the other layer contains a negative image of marker particles.

Nakai and Mikami, in U.S. Pat. No. 3,544,405, disclose a method of making a reversible sol-gel laminate. Their process addresses a novel method for coating a photographic light sensitive element. Their method comprises means for forming a stretched gel layer, said layer containing light-sensitive material, and laminating said gel layer to a support. This process is a method of producing photographic elements prior to their use in generating images.

Davis, in U.S. Pat. No. 3,395,073, discloses a suction roll assembly for extracting fluid from a fibrous web in the production of fibrous sheet materials such as paper. Davis discloses a suction roller having adjustable vacuum seals. The adjustable seals move in a transverse direction to accommodate variations in web widths.

Francis et al., in U.S. Pat. No. 3,677,753, disclose a system for removal of an imaging layer in an instant motion picture film unit. This system essentially separates donor and receiver elements, wherein these elements are substantially wet prior to and during separation. The apparatus described uses a pinch roller in contact with a planar backing during the stripping or separation process.

Hosaka et al., in U.S. Pat. No. 4,668,602, disclose a peel-apart photographic system which contains stripping and delaminating elements.

Hanselman et al., in U.S. Pat. No. 4,359,518, disclose a method of removing a photosensitive imaging layer from a diffusion transfer film unit after the image has been formed and transferred. This method utilizes a stripping sheet, and the sheet is contacted with substantially wet donor elements prior to stripping. This stripping sheet has incorporated chemistry that causes the sheet material to change from being substantially impermeable to aqueous solution to being substantially permeable to aqueous solution.

Copending and commonly assigned U.S. patent applications relating to delamination imaging systems include U.S. application Ser. No. 7/805,717, filed Dec. 6, 1991, Mechanicochemical Layer Stripping in Image Separation Systems of Texter et al., the earlier cited U.S. application Ser. No. 7/804,877, filed Dec. 6, 1991, Heat Image Separation System of Willis and Texter, and U.S. application Ser. No. 7/804,868, filed Dec. 6, 1991, Thermal Solvents for Dye Diffusion in Image Separation Systems of Bailey et al.

While the previous system of U.S. application Ser. No. 7/804,877 is satisfactory, there remains the problem of how to effect improved mechanical separation of the corresponding donor and receiver components of the photographic system in an automatic way that requires relatively little intervention by operators. There is also a need to effectively collect and store accumulated waste from the layer stripping operation, especially in a form suitable for recycling.

Some of the stripping and delamination methods disclosed in the prior art require the elements to be substantially wet prior to the process of delamination and separation of donor and receiver elements. The accumulation of such waste material in a wet form is undesirable, particularly in large volume applications such as commercial photofinishing.

DISCLOSURE OF INVENTION

It is an object of our invention to overcome disadvantages of the prior processes and apparatus.

It is an object of the present invention to provide new and improved apparatus for mechanically separating the donor and receiver elements of an integral photographic material in an automatic way that requires relatively little intervention by operators.

Another object of the present invention is to provide a new stripping assembly, for imparting vacuum and shear forces to an integral photographic element and thereby effect the delamination of said element into two component elements.

Yet a further object of the present invention is to provide means for collecting and storing accumulated solid waste in a form convenient for handling by operators.

An additional object of the present invention is to provide a delamination system that is flexible and is applicable to numerous extant photofinishing processes.

These and other objects of the invention are generally accomplished by a method of delaminating imaging materials comprising providing an imaging material comprising donor and receiver elements, heating said imaging material, applying opposed forces to said donor and receiver elements to separate said imaging material into donor and receiver elements, and accumulating the separated donor element. In a preferred method one or both of said opposed forces is vacuum and when the vacuum is released from said donor element, accumulating takes place by spooling after separation.

The apparatus for delamination of imaging materials comprises means for applying heat and pressure to said imaging material, means to apply a separating force to at least one of said donor element and receiver element forming said imaging material and means to separate said donor element and said receiver element. In a preferred embodiment the apparatus further comprises means to spool said donor element and means to preheat said imaging material prior to applying said separating force.

MODES FOR CARRYING OUT THE INVENTION

In accordance with the invention, apparatus and methods are provided for delaminating an imaging material (integral photographic composite element) into two separable (donor and receiver elements) components by passing said material through a stripping assembly, wherein said assembly comprises opposing vacuum rollers. In preferred embodiments said vacuum rollers contain baffles for throttling the vacuum over certain arcs of the roller surface. In other embodiments said stripping assembly comprises a vacuum platen and a take-up roll for the separated donor element. The separated donor element is preferably spooled on a take-up assembly. Said material is preferably passed into a preheater assembly and subsequently through opposing pressure and heating rollers prior to being passed through a stripping assembly. Said preheater assembly comprises means for adjusting and controlling the temperature of the integral element over the range of 25° to 200° C. and means for adjusting and controlling the relative humidity of the atmosphere contacting the integral element over the range of 10% to 95%. In preferred embodiments the preheater assembly also comprises heated pinch rollers for applying heat and pressure to the integral element. The waste pick-up roll assembly comprises means for spooling the donor element, and in certain preferred embodiments the waste pick-up assembly also comprises means for contacting the donor element with an adhesive element, in the form of a continuous sheet, to provide a donor element/adhesive element laminate, and wherein said laminate is subsequently spooled on a take-up roll.

These and other objects and advantages of the present invention will become apparent from the following detailed description of preferred embodiments and from a review of the drawings of the invention attached hereto.

The method and apparatus of the invention can be used in any photofinishing operation prior to the chopping of prints. For example, rolls of processed paper print material, as currently produced in numerous photofinishing plants worldwide, can be fed directly into the apparatus embodiments of this invention. Moreover, the separated receiver/support element, as wound up subsequent to delamination, is suitable for processing by the extant chopping and slitting methods in the photofinishing industry.

Figure 1:
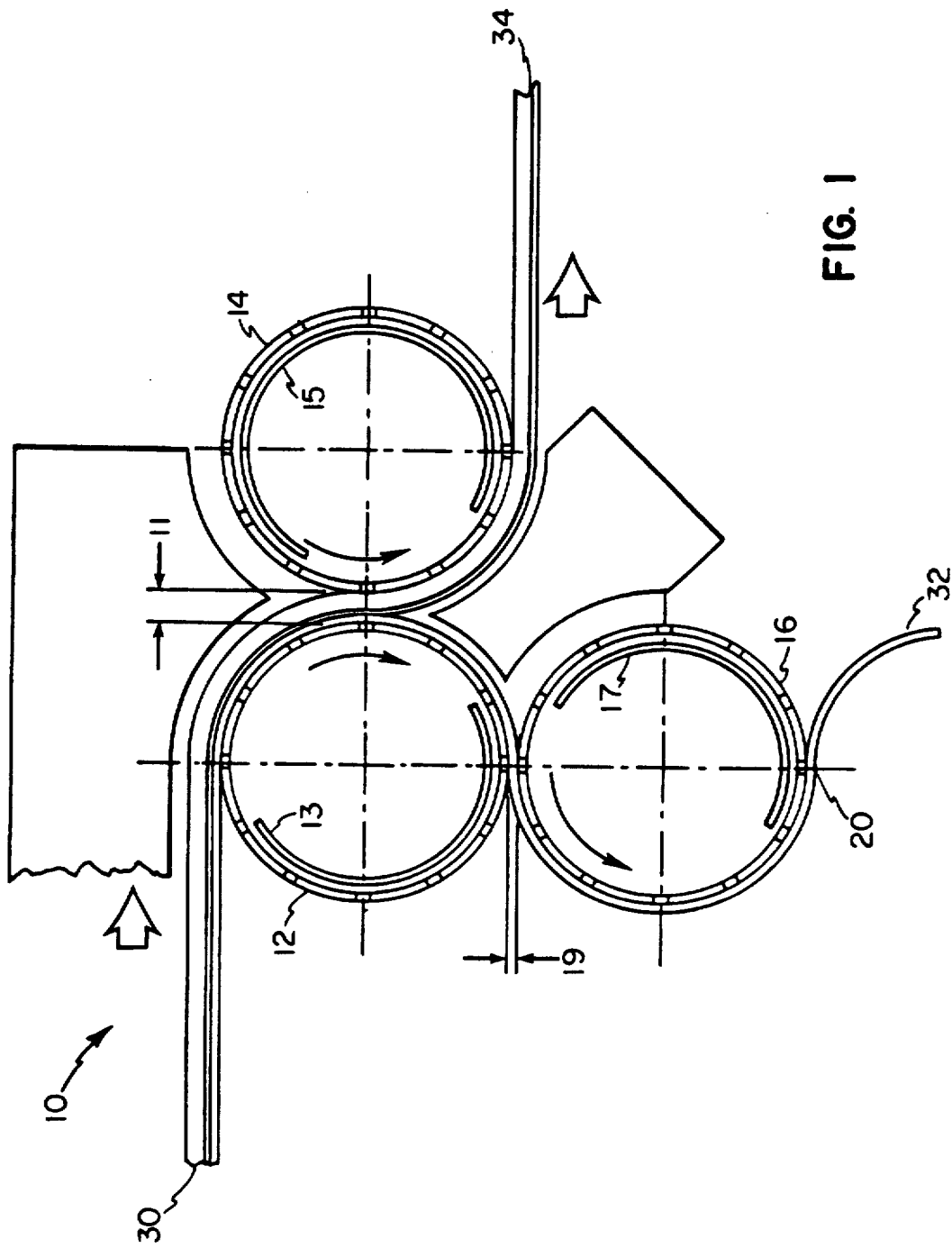
FIG. 1. Stripper section subassembly 10, comprising three vacuum rollers, for separating donor layers from receiver/support layers.
Figure 2:
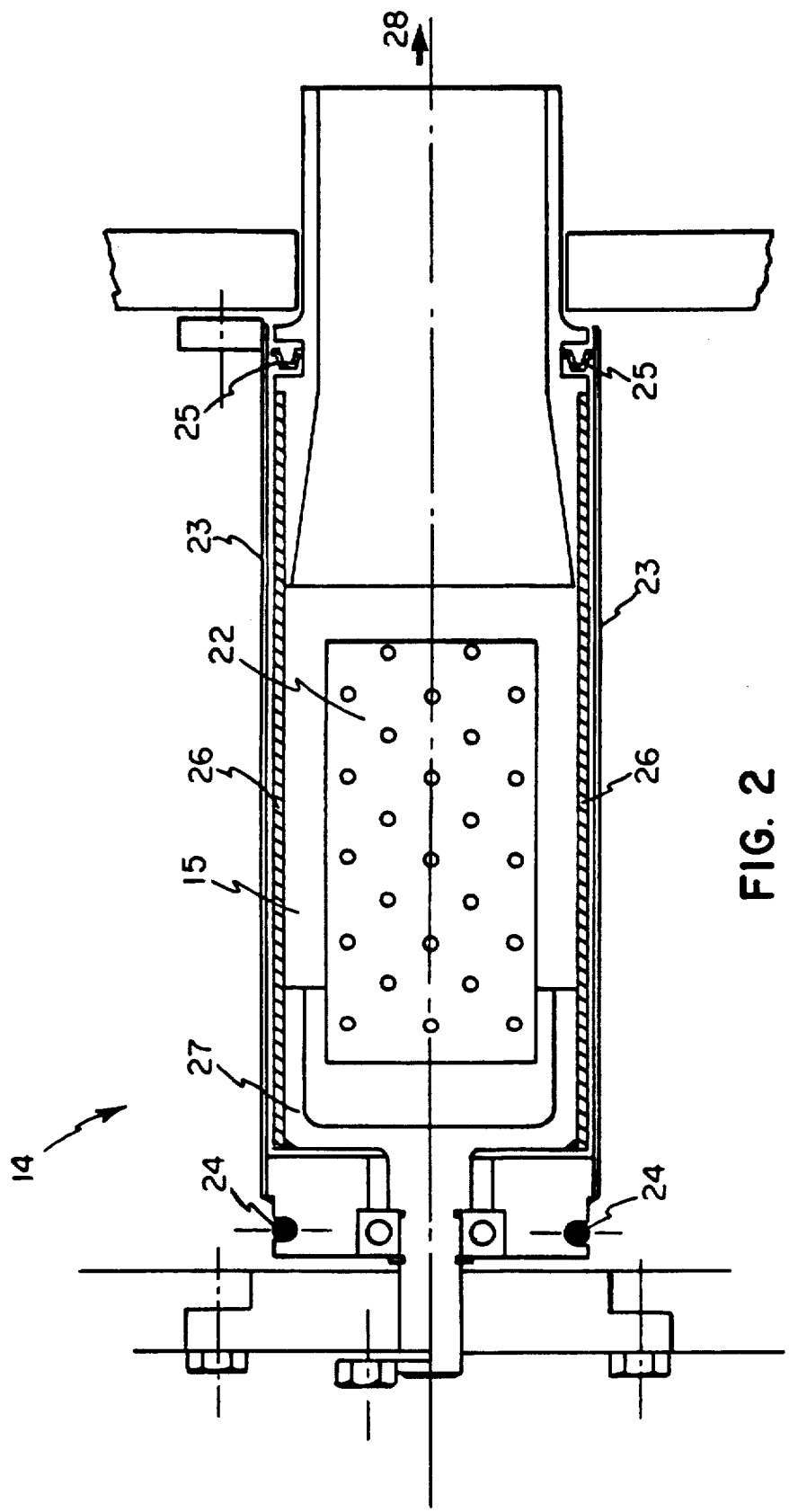
FIG. 2. Cross-sectional view of the vacuum roller 14. The perforated tube 22 is shown rotating over an internal baffle 15.
Figure 3:
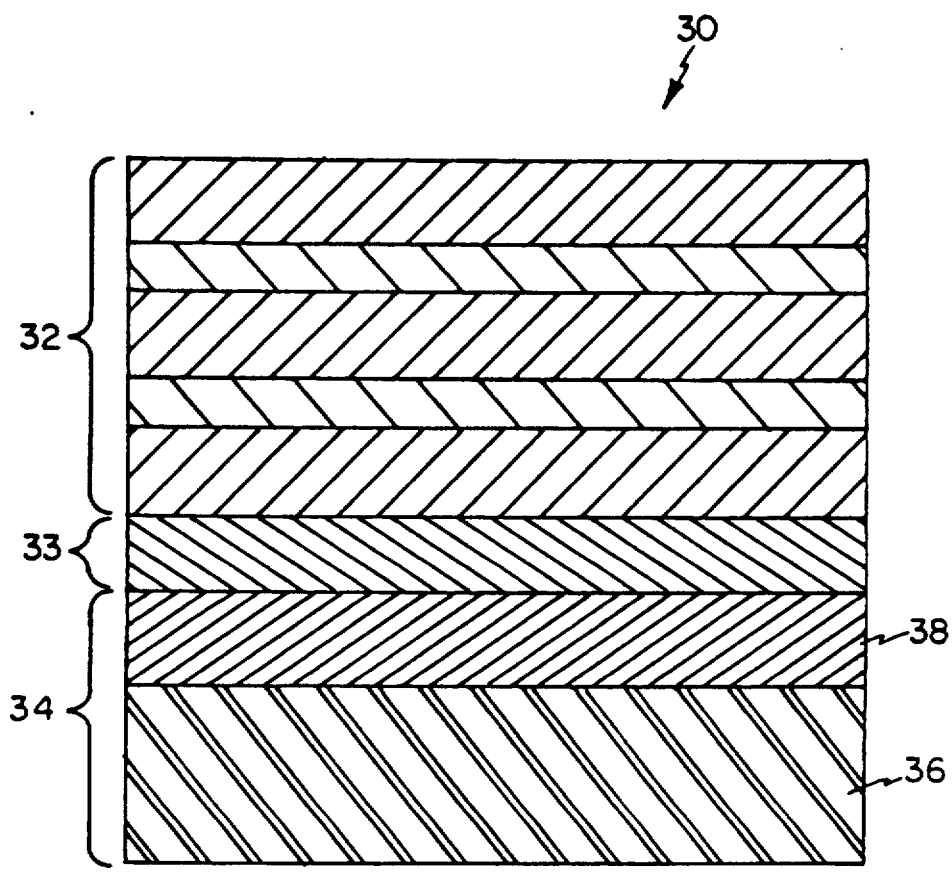
FIG. 3. Integral photographic element 30 comprising separable donor 32 and receiver 34 components.

A vacuum roller subassembly 10, comprising three vacuum rollers 12, 14, and 16 with throttling baffles 13, 15, and 17 is illustrated in FIG. 1. A cross-sectional view of vacuum roller 14 is illustrated in FIG. 2, where the rotation of a perforated tube with outer roller surface 22 is shown in perpendicular view rotating over an internal baffle 15. This outer roller surface is shown in cross-section as 23. This outer roller is driven by drive belt 24. This outer roller is mounted at its opposite end by means of a flexible ring seal 25. The inner surface of the internal baffle 15 is shown connecting to a mounting gudgeon 27. Vacuum is pulled in the direction illustrated by the air flow arrow 28. This internal baffle is also illustrated in cross-section as 26. Internal baffles preferably may be independently rotatable, sliding, or a combination of both may be programmed. The relative angular orientations of internal baffles 13, 15, and 17 are illustrated for the various rollers in FIG. 1. An integral composite element 30 is illustrated feeding in and through this roller assembly. This element 30 is illustrated in greater detail in FIG. 3, where it is seen that the composite structure of the element consists essentially of two separable components, 32 and 34. These separable components meet at stripping layer 33. This stripping layer may simply comprise the geometrical interface between components 32 and 34. This stripping layer 33 may also comprise any polymeric material which serves to maintain dimensional integrity during silver halide development processing and which facilitates the mechanical separation of components 32 and 34 when suitable opposing forces are applied. This separation may occur at the interface of layers 32 and 33, at a fracture surface partly or entirely interior to layer 33, and at the interface of layers 33 and 34. Preferred polymeric materials for utilization in the stripping layer 33 are adepic acid polyester, cellulose acid hydrogen phthalate, and hydroxyethyl cellulose.

The donor component 32 comprises one or more layers containing chemistry that generates diffusible dyes for a photographic image transfer system. A typical multilayer, multicolor photographic element according to this invention comprises a support having thereon a red sensitive silver halide emulsion layer having associated therewith a cyan dye image forming coupler compound, a green-sensitive silver halide emulsion layer having associated therewith a magenta dye image forming coupler compound and a blue sensitive silver halide emulsion layer having associated therewith a yellow dye image forming coupler compound. Each silver halide emulsion layer can be composed of one or more layers and the layers can be arranged in different locations with respect to one another. Typical arrangements are described in *Research Disclosure*, Issue Number 308, pp. 993-1015, published December, 1989 (hereafter referred to as "Research Disclosure"), the disclosure of which is incorporated by reference.

The light sensitive silver halide emulsions can include coarse, regular or fine grain silver halide crystals of any shape or mixtures thereof and can be comprised of such silver halides as silver chloride, silver bromide, silver bromoiodide, silver chlorobromide, silver chloroiodide, silver chlorobromoiodide and mixtures thereof. The emulsions can be negative working or direct positive emulsions. They can form latent images predominantly on the surface of the silver halide grains or predominantly on the interior of the silver halide grains. They can be chemically or spectrally sensitized. The emulsions typically will be gelatin emulsions although other hydrophilic colloids as disclosed in Research Disclosure can be used in accordance with usual practice.

The receiver element 34 comprises a support 36 and one or more layers 38 designed to mordant diffusible dyes generated in earlier processing of the donor layers and integral element as a whole. The dye receiving layer to which the formed dye image is transferred according to the process of the invention may be present as a coated or laminated layer between the support and silver halide emulsion layer(s) of the photographic element, or the photographic element support itself may function as the dye receiving layer. Alternatively, the dye receiving layer may be in a separate dye receiving element which is brought into contact with the photographic element by means not shown before or during the dye transfer step. If present in a separate receiving element, the dye receiving layer may be coated or laminated to a support such as those described for the photographic element support above, or may be self-supporting. In a preferred embodiment of the invention, the dye-receiving layer is present between the support and silver halide emulsion layer of an integral photographic element.

The dye receiving layer may comprise any material effective at receiving the transferable dye image. Examples of suitable receiver materials include polycarbonates, polyurethanes, polyesters, polyvinyl chlorides, poly(styrene-co-acrylonitrile)s, poly(caprolactone)s and mixtures thereof. The dye receiving layer may be present in any amount which is effective for the intended purpose. In general, good results have been obtained at a concentration of from about 1 to about 10 $g/m^2$ when coated on a support. In a preferred embodiment of the invention, the dye receiving layer comprises a polycarbonate. The term polycarbonate as used herein means a polyester of carbonic acid and a glycol or a dihydric phenol. Examples of such glycols or dihydric phenols are p-xylylene glycol, 2,2-bis(4-oxyphenyl) propane, bis(4-oxyphenyl)methane, 1,1-bis(4-oxyphenyl) ethane, 1,1-bis(oxyphenyl)butane, 1,1-bis(oxyphenyl) cyclohexane, 2,2-bis(oxyphenyl)butane, etc. In a particularly preferred embodiment, a bisphenol-A polycarbonate having a number average molecular weight of at least about 25,000 is used. Examples of preferred polycarbonates include General Electric LEXAN® Polycarbonate Resin and Bayer AG MACROLON 5700®. Further, a thermal dye transfer overcoat polymer as described in U.S. Pat. No. 4,775,657 may also be used.

The support can be of any suitable material used with photographic elements. Typically, a flexible support is employed, such as a polymeric film or paper support. Such supports include cellulose nitrate, cellulose acetate, polyvinyl acetal, poly(ethylene terephthalate), polycarbonate, white polyester (polyester with white pigment incorporated therein) and other resinous materials as well as glass, paper or metal. Paper supports can be acetylated or coated with baryta and/or an alpha-olefin polymer, particularly a polymer of an alpha-olefin containing 2 to 10 carbon atoms such as polyethylene, polypropylene or ethylene butene copolymers. The support may be any desired thickness, depending upon the desired end use of the element. In general, polymeric supports are usually from about 3 μm to about 200 μm and paper supports are generally from about 50 μm to about 1000 μm.

The sequential separation of components 32 and 34 as a consequence of the applied shear and vacuum in this assembly is illustrated in FIG. 1. Vacuum roller 12 picks up the integral element 30 on the donor 32 side. The integral element at this stage has a surface temperature of between 25° and 175° C. As the integral element proceeds 90° around roller 12, the receiver side 34 of the integral element 30 is picked up by vacuum roller 14, producing a strain within the composite element 30 at the donor 32/receiver 34 interface 33. This strain is greater than the adhesive force between these layers, and elements 32 and 34 separate. With the loss of vacuum from roller 12, the donor element 32 transfers to roller 16. Roller 16 rotates to a waste pick-up point 20, where the internal baffle 17 cuts off the vacuum and releases the donor element 32. The donor element is recycled or discarded and preferably is wound onto a waste roll. Illustrated in FIG. 1 is the separation at the nip of rollers 12 and 14 of element 30 into its components 32 and 34. This separation is effected by the shear and vacuum applied to the respective outer surfaces of the element 30. Typical clearances 11 at the nip between rollers 12 and 14 will be of the order of 0.02 to 0.05 mm, but will depend of course on the thickness of the integral element 30 separated in the assembly. Typical clearances 19 at the nip between rollers 12 and 16 will be of the order of 0.005 to 0.03 mm, again depending on the composition and thickness of the donor element 32. The surfaces of these rollers may each independently be controlled in temperature by any resistive or radiant heating method well known in the art. Furthermore, the pressure applied at each of the roller nips may be independently controlled to accommodate different kinds of integral elements 30 having different thicknesses and comprising various detailed layer structures in the donor 32 and receiver 34 elements.

Figure 4:
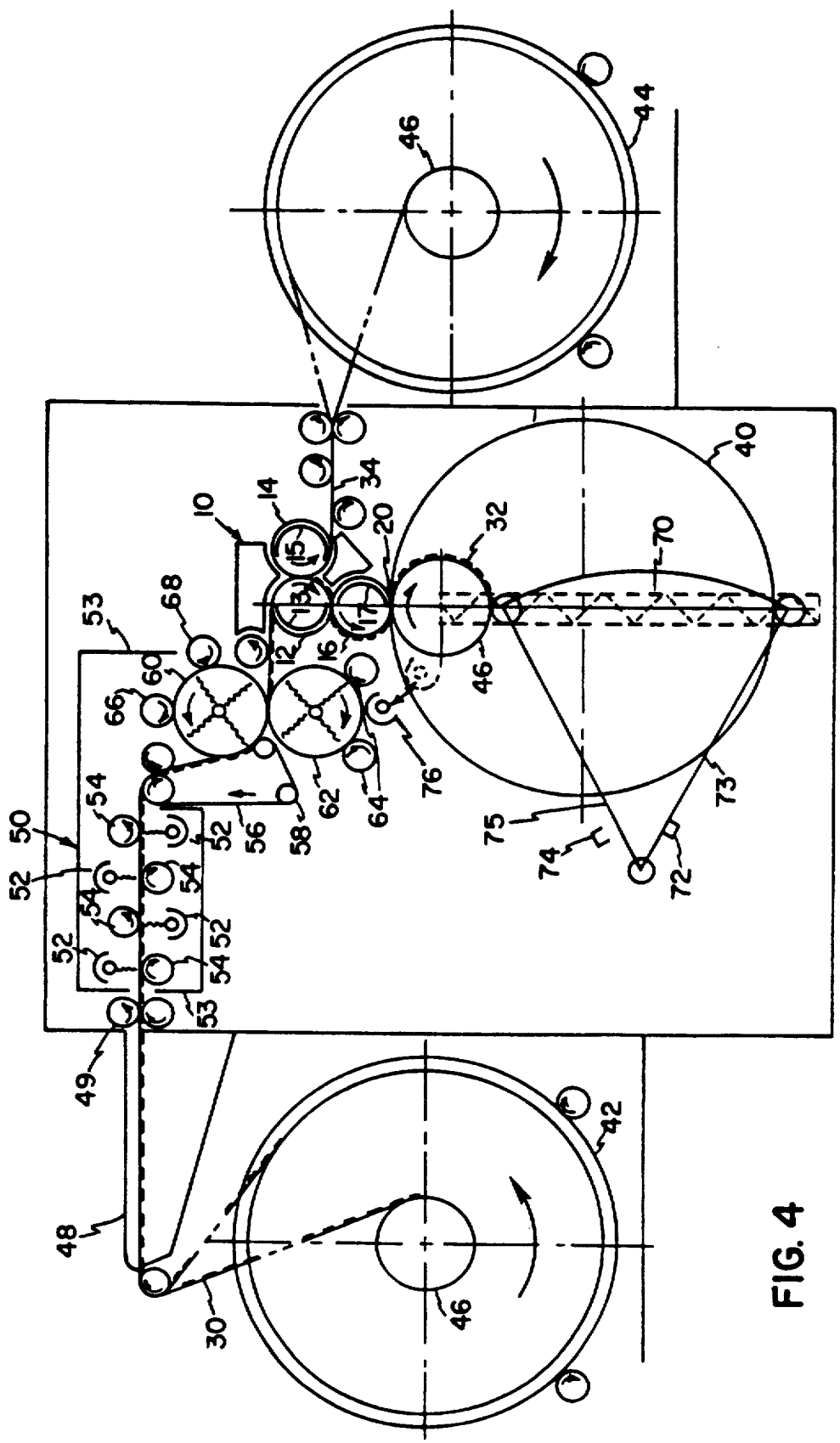
FIG. 4. Embodiment A of complete delamination system showing the transport system, including the stripper section 10 and waste pick-up point 20 illustrated in FIG. 1.

Embodiment A of a complete transport system is illustrated in FIG. 4. This embodiment illustrates the combination of the stripper section assembly 10, waste pick-up assembly roll 40, feed assembly roll 42, receiver element take-up roll 44, and preheater assembly 50. It is preferred that the feeder 42, waste 40, and take-up 44 roll assemblies use identical reels and spools 46 for ease of interchangability and have indentical core diameters. Said cores are preferably paper and about 7.6 cm in diameter. The feed roll 42 feeds the composite integral element 30 into a feed tray 48, and subsequently through a pacer roll 49 detection system and into a preheater assembly 50. Assembly 50, partially enclosed by heat shields 53, comprises infrared (IR) heaters 52 and a gang of transport rollers 54. In a preferred embodiment, the preheater assembly 50 also provides, by means not shown, relative humidity control preheater assembly 50, adjustable from 10 percent to 95% relative humidity. In the the integral element 30 passes onto a perforated belt 56 after the IR heaters 52 and transport rollers 54. This belt is driven by a crown roller 58, and takes the integral element 30 to the nip of preferably heated pressure rollers 60 and 62. Pressure rollers 60 and 62 are preferably heated with internal IR sources not shown, but may be heated by other means. Preferably nip temperatures of from about 75° to 190° C. are maintained by said heaters. This assembly is driven by drive rollers 64. Transport speeds of about 0.1 to 50 cm/sec are preferred. Pressure is applied adjustably by means of roller 66 in combination with keeper roller 68. Nip pressures of from about 500 Pa to about 1,000 kPa are preferred. After passing through the nip of these pressure rollers the integral composite element passes out of the preheater assembly 50 and into the stripper assembly 10, comprising in this preferred embodiment three vacuum rollers 12, 14, and 16 with internal baffles 13, 15, and 17. The integral element is separated into its donor 32 and receiver 34 components as described above. The donor element 32 is fed to the waste pick-up point 20 and onto the waste roll 40. In this embodiment, the waste roll core and reel are mounted on a balance spring assembly 70; said spring assembly having adjustable travel and means for taking up the donor element 32 in concert with the feed rate at the waste pick-up point 20. Said balance spring assembly 70 and roll assembly 40 also has an associated sensor 72 and indicator arm 73 to indicate when the roll is full. Sensors also indicate if the roll core is present, with sensor 74 and indicator arm 73. In preferred embodiments, a travelling IR heater 76 is situated in close proximity to the waste pick-up point 20. The heater 76 dries the waste prior to rolling to reduce weight and size of the waste roll. The receiver element 34 exits the stripper assembly 10 around roller 16, along transport rollers and onto the take-up reel 44.

Figure 5:
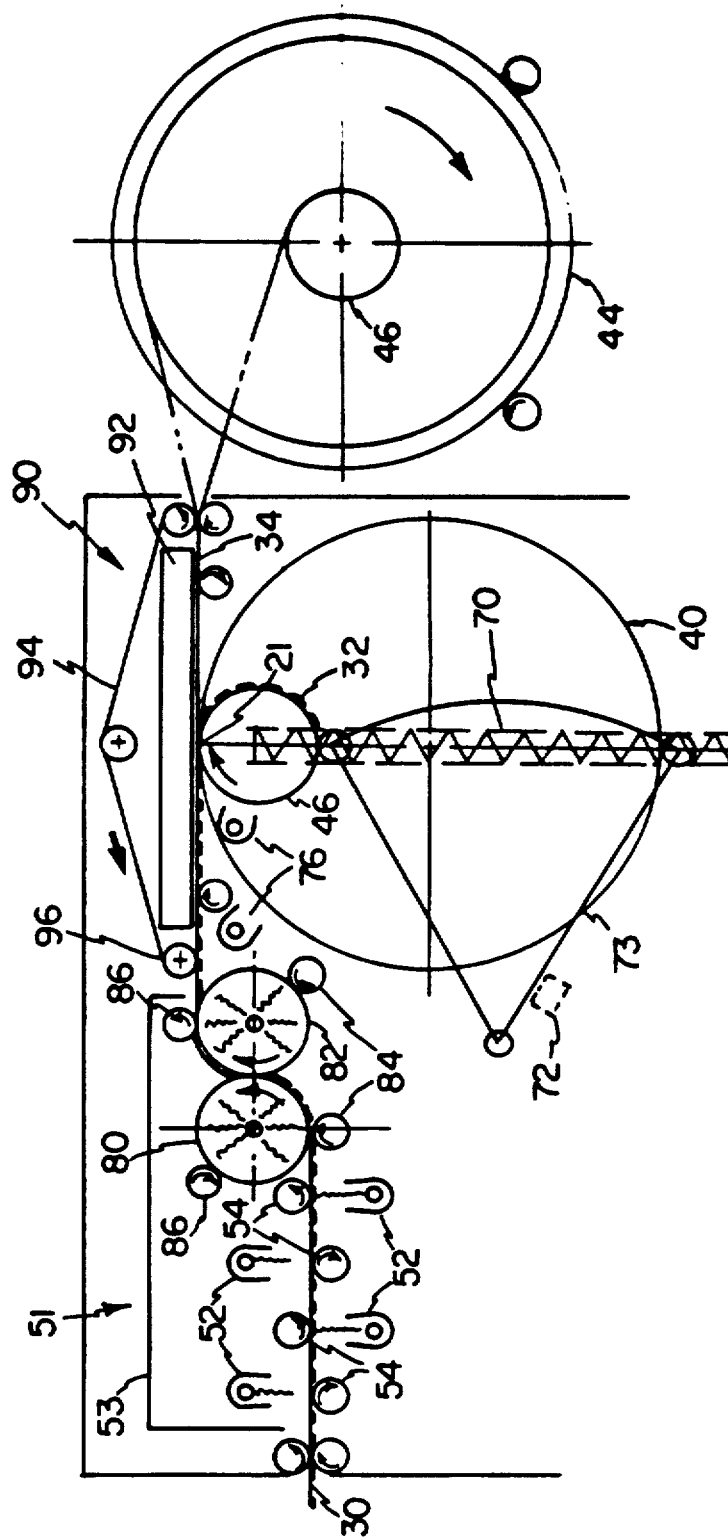
FIG. 5. Embodiment B of a delamination system illustrating the use of a vacuum platen rather than a vacuum roller stripping assembly.

Embodiment B of a transport system is illustrated in FIG. 5. The illustrated take-up assembly and roll are identical to those illustrated in FIG. 4. The feed assembly, not illustrated, is identical to that illustrated in FIG. 4. The integral composite element 30 is shown entering the preheater assembly 51. This preheater assembly in most respects is identical to the comparable assembly 50 illustrated in FIG. 4, and comprises a gang of IR heaters 52 and a gang of transport rollers 54. Heated pressure rollers 80 and 82 are driven by drive rollers 84, and pressure between rollers 80 and 82 is maintained using adjustable rollers 86. Rollers 80 and 82 are preferably heated with internal IR sources not shown, but may be heated by other means. The integral composite element 30 is picked up by roller 80 and rotates 90° up to the pressure nip, where the donor 32 side of the integral element contacts roller 82. The integral element then rotates 90° over roller 82 and exits the preheater assembly 51 and feeds into a vacuum stripper assembly 90.

This stripper assembly 90 comprises a vacuum platen 92, a perforated transport belt 94, pivot point 96, and a waste pick-up point 21. The vacuum platen 92 pivots at point 96 to facilitate removal, vertically, of waste rolls 40. The waste roll assembly, including the balance spring assembly 70, full-sensor 72 and indicator arm 73, and traveling heater 76 are essentially identical to those described above in embodiment A. Subsequent to the integral element 30 feeding into the vacuum platen stripper assembly, said element is picked up by the perforated transport belt and transported along the surface of the vacuum platen. At the waste pick-up point 21, the rotating waste pick-up roll imparts strain to the composite element 30, and the donor 32 and receiver 32 elements separate. The waste take-up roll is driven by a torque motor drive not shown. The donor element 32 is wound around the waste roll 40 and the receiver element 34 exits the stripper assembly and is wound around the take-up roll 44.

A nip-roller mechanicochemical layer stripping assembly has been disclosed in earlier cited U.S. application Ser. No. 7/805,717, where such rollers are heated and variable pressure is applied to the nip. This assembly is a preferred method for delaminating integral and separable elements, and U.S. application Ser. No. 7/805,717 is incorporated herein by reference for all that it discloses.

Figure 6:
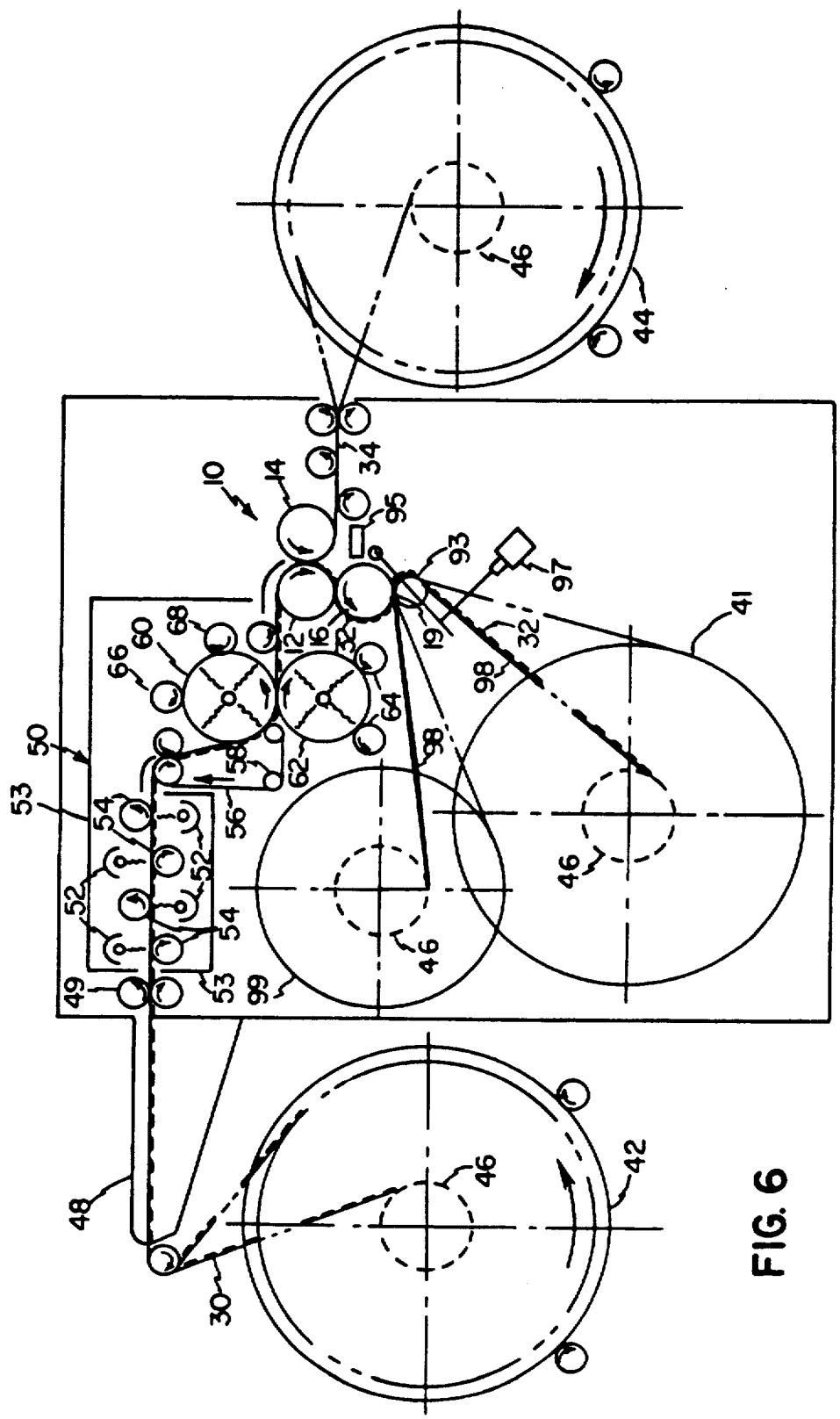
FIG. 6. Embodiment C of complete delamination system illustrating alternative to the stripper section of embodiment A.

Another embodiment C of a complete transport system is illustrated in FIG. 6. The support or receiver 34 side of the transport system is essentially identical to that described for embodiment A in FIG. 4. The main difference illustrated here is in the waste (donor) pick-up operation, that uses an auxiliary element 98 (adhesive web, stripping sheet) to contact and support the donor element 32 after separation from the receiver element 34. At the pick-up point 19, an adhesive web 98, as described for example in U.S. application Ser. No. 7/805,717, herein incorporated by reference, contacts the donor element 32, forms an adhesive bond to the donor element, and transports the donor element to the waste pick-up roll 41. This adhesive web is provided from a supply roll 99 which utilizes a standard core 46. A pick-up roll 93 provides pressure contact at the pick-up point 19. The adhesive web 98 comprises a support material, such as conventional film base, and an adhesive polymeric coating. This coating may comprise any suitable material that will when dry adhere to imaging layers 32 under pressure and optionally heat. The preferred material has been found to be dry gelatin, where by "dry" it is meant that the water content is less than 15 percent by weight. It is preferred that the water content be that typical of dry film gelatin or about 10 percent by weight. A pick-up solenoid 97 provides control to the torque motor drives for the waste pick-up assembly. Control switching is provided by a leading and trailing edge switch assembly 95.

In an embodiment D not illustrated, but closely related to embodiment C (FIG. 6), the adhesive web element 98 is contacted with the donor side 32 of the integral element 30 in the nip of the pressure rollers 60 and 62. The vacuum roller stripping assembly 10 is omitted in D. Delamination of donor 32 and receiver 34 at stripping layer 33 is effected by shear forces induced by the take-up in separate directions of receiver 34 and adhesive web 98. This delamination is effected subsequently to passing the laminate of integral element 30 and web 98 through the nip of the pressure rollers 60 and 62, as can be envisioned by redefining certain of the rollers in FIG. 6. For example, if vacuum rollers 12 and 14 are replaced by ordinary transport rollers, and if vacuum roller 16 and contact roller 93 are omitted, the web 98 laminate with donor 32 can be fed directly to the waste pick-up roll assembly 41 while the receiver 34 is transported to the receiver take-up roll 44, in much the same way as is illustrated in FIG. 6 for embodiment C.

Numerous modifications and variations of this invention are possible in view of the above disclosure. It is therefore understood that within the scope of the claims appended hereto, the invention may be carried out using all suitable modifications falling within said scope.

What is claimed is:

1. A method of delaminating silver halide imaging materials comprising providing an integral composite imaging material comprising donor and receiver elements, heating said imaging material, applying opposed forces to said donor and receiver elements to separate said imaging material into donor and receiver elements, and accumulating the separated donor element, wherein at least one said opposed forces is vacuum.

2. The method of claim 1, wherein said both opposed forces are vacuum.

3. The method of claim 1, wherein said vacuum is released from said donor element when accumulating takes place.

4. The method of claim 1, wherein said accumulating of said donor is by spooling after being separated.

5. The method of claim 4, wherein said donor is heated prior to said spooling.

6. The method of claim 1, wherein said imaging material is subjected to heat and pressure prior to applying said opposed forces.

7. The method of claim 6, wherein said imaging material is preheated prior to being subjected to heat and pressure.

8. The method of claim 6, wherein said imaging material is humidity adjusted prior to pressure and heat application.

9. The method of claim 6, wherein said heat is applied by a heated roller to the receiver side of said imaging material.

10. The method of claim 6, wherein said heat is applied by a heated roller to the donor side of said imaging material.

11. Apparatus for delamination of silver halide integral composite imaging materials comprising donor and receiver elements, said apparatus comprising means for applying heat and pressure to said imaging material, means to apply a separating force to at least one of said donor element and receiver element forming said imaging material and means to separate said donor element and said receiver element, wherein said separating force comprises a vacuum force.

12. The apparatus of claim 11, further comprising means to spool said donor element.

13. The apparatus of claim 12, further comprising means to heat said donor element immediately prior to said means to spool said donor element.

14. The apparatus of claim 11, further comprising means to preheat said imaging material prior to applying said separating force.

15. The apparatus of claim 11, further comprising said means to apply separating force comprising means to apply vacuum to both the donor and receiver elements.

16. The apparatus of claim 15, wherein said vacuum is applied by opposed rollers.

17. The apparatus of claim 15, wherein said means to apply vacuum comprises a vacuum platen positioned to apply vacuum on the receiver layer.

18. The apparatus of claim 17, further comprising a perforated belt passing between said donor element and said vacuum platen.

19. The apparatus of claim 11, wherein said means to separate comprises a spooling means for said donor element.

20. The apparatus of claim 11, wherein said means to apply heat and pressure comprises opposed pressure rollers wherein at least one of said pressure rollers is heated.

21. The apparatus of claim 11, further comprising means for humidity control prior to said separating force.

* * * * *